(12) United States Patent
Wang et al.

(10) Patent No.: US 12,346,024 B2
(45) Date of Patent: Jul. 1, 2025

(54) METHOD OF MANUFACTURING A MASTER FOR A REPLICATION PROCESS

(71) Applicant: ams-OSRAM Asia Pacific Pte. Ltd., Singapore (SG)

(72) Inventors: Ji Wang, Singapore (SG); Kam Wah Leong, Singapore (SG); QiChuan Yu, Singapore (SG); Sundar Raman Gnana Sambandam, Singapore (SG)

(73) Assignee: ams-OSRAM Asia Pacific Pte. Ltd., Singapore (SG)

( * ) Notice: Subject to any disclaimer, the term of this patent is extended or adjusted under 35 U.S.C. 154(b) by 580 days.

(21) Appl. No.: 17/607,089

(22) PCT Filed: May 28, 2020

(86) PCT No.: PCT/SG2020/050312
§ 371 (c)(1),
(2) Date: Oct. 28, 2021

(87) PCT Pub. No.: WO2020/242385
PCT Pub. Date: Dec. 3, 2020

(65) Prior Publication Data
US 2022/0229362 A1    Jul. 21, 2022

Related U.S. Application Data

(60) Provisional application No. 62/855,206, filed on May 31, 2019.

(51) Int. Cl.
*G03F 7/00* (2006.01)
*G03F 7/16* (2006.01)

(52) U.S. Cl.
CPC ............ *G03F 7/0005* (2013.01); *G03F 7/162* (2013.01); *G03F 7/168* (2013.01)

(58) Field of Classification Search
None
See application file for complete search history.

(56) References Cited

U.S. PATENT DOCUMENTS

| 4,015,986 A | 4/1977 | Paal et al. |
| 6,124,081 A | 9/2000 | Kishimura |

(Continued)

FOREIGN PATENT DOCUMENTS

| DE | 3305923 A1 | 8/1984 |
| EP | 1542074 A1 | 6/2005 |

(Continued)

OTHER PUBLICATIONS

International Search Report with Written Opinion for related Application No. PCT/SG/2020/050312 dated Sep. 25, 2020 (10 Pages).

(Continued)

*Primary Examiner* — Sean M DeGuire
*Assistant Examiner* — Andrew Preston Traywick
(74) *Attorney, Agent, or Firm* — Viering, Jentschura & Partner mbB

(57) ABSTRACT

A method of manufacturing a master for use in a wafer-scale replication process is disclosed. The method comprises at least one step of forming a layer of photoresist on a substrate and exposing the layer of photoresist to a radiation pattern to form at least one patterned layer. The method also comprises a step of developing the at least one patterned layer to provide one or more structures defining the master. In an embodiment, the at least one step of forming the layer of photoresist comprises a process of dry film lamination.

17 Claims, 6 Drawing Sheets

(56) References Cited

U.S. PATENT DOCUMENTS

| | | | |
|---|---|---|---|
| 6,350,360 B1 | 2/2002 | Bonivert et al. | |
| 6,410,213 B1 * | 6/2002 | Raguin | G03F 7/001 |
| | | | 430/323 |
| 8,221,665 B2 * | 7/2012 | Rudmann | B82Y 40/00 |
| | | | 264/225 |
| 2002/0100691 A1 * | 8/2002 | Bonivert | G03F 7/0002 |
| | | | 427/259 |
| 2003/0219992 A1 * | 11/2003 | Schaper | G03F 7/0002 |
| | | | 438/748 |
| 2004/0170930 A1 | 9/2004 | Kawaguchi et al. | |
| 2005/0079448 A1 | 4/2005 | Nakada et al. | |
| 2006/0226576 A1 * | 10/2006 | O'Brien | G02B 6/423 |
| | | | 264/293 |
| 2006/0259546 A1 | 11/2006 | Rudmann et al. | |
| 2008/0047930 A1 * | 2/2008 | Blanchet | B82Y 40/00 |
| | | | 438/758 |
| 2013/0250418 A1 * | 9/2013 | Scott | G03F 7/0005 |
| | | | 359/530 |
| 2017/0090294 A1 * | 3/2017 | Kriman | B29D 11/00307 |
| 2018/0284614 A1 | 10/2018 | Satoh et al. | |

FOREIGN PATENT DOCUMENTS

| | | |
|---|---|---|
| WO | 0177415 A1 | 10/2001 |
| WO | 2005025748 A1 | 3/2005 |
| WO | 2007140643 A1 | 12/2007 |

OTHER PUBLICATIONS

First Office Action and first search issued for the corresponding Chinese patent application No. 202080040428, dated Oct. 28, 2023, 9 pages (for informational purposes only).

* cited by examiner

METHOD OF MANUFACTURING A MASTER FOR A REPLICATION PROCESS

FIELD

The present disclosure is in the field of manufacturing wafer-scale micro-optical elements by a process of replication. More specifically, the disclosure relates to a method of manufacturing a master, a sub-master and use of the master or sub-master to form elements for such micro-optical devices.

BACKGROUND

Micro-optical devices are used in a wide range of applications including, for example, camera devices such as those used in cellular telephones. Fabricating a wafer-scale element for use in such a micro-optical device may include replicating elements directly onto a wafer using a replication tool.

There are presently various replication processes employed in the fabrication of micro-optical elements. Such replication process may include, for example, injection molding, hot embossing and UV embossing. As an example, in an embossing process a surface topography of a replication tool, known in the art as a "master" or a "sub-master" is duplicated into a thin film of a UV-curable epoxy resin on top of a substrate.

For example, in the case fabricating wafer-scale elements for micro-optical devices the surface topography of a master—and thus any subsequently formed sub-masters—can be designed to produce a refractive or a diffractive structure, or a combination of both. Similarly, the surface topography can be designed to produce other elements for micro-optical devices, such as spacers for forming micro-optical modules and/or optical baffles for restricting or directing radiation.

Wafer-scale replication allows the fabrication of multiple substantially identical elements using a single process. For example, a step-and-repeat replication process using a small master/sub-master may be used to form elements on a substrate prior to subsequent dicing of the substrate into individual devices. Alternatively, a larger, e.g. wafer-sized master/sub-master may be employed to form simultaneously form a multitude of such of elements on a substrate.

A variety of techniques exist for manufacturing masters for use in replication processes. For example, existing techniques may comprise precision cutting and/or milling an element, such a copper plate, to form a master with a desired surface topography. Such milling and cutting may be performed by CNC (Computer Numerically Controlled) machining. Nevertheless, a resolution and fidelity achievable by such production techniques may be limited.

It is therefore an aim of at least one embodiment of at least one aspect of the present disclosure to obviate or at least mitigate at least one of the above identified shortcomings of the prior art.

SUMMARY

In general, this disclosure proposes to overcome the above shortcomings of the prior art by disclosing a lithographic process for forming a master for use in manufacturing elements for micro-optical devices by a process of replication. Among other advantages described below, a process of manufacturing a master or sub-master according to the disclosed methods would result in a master or sub-master with a higher fidelity and potentially more complex topography than would be achievable using prior art manufacturing methods.

The wafer-scale replication allows the fabrication of several hundred identical structures with a single step, e.g. a single or double-sided UV-embossing process. The subsequent dicing step of the wafer then yields the individual micro-optical components. For an efficient wafer-scale replication technology a wafer-scale tool and consequently a wafer-scale master or sub-master is required. However, in many cases it is either not possible or very costly to produce a master that covers a sufficiently large area (typically at least 4-6 inches). For instance, mastering techniques such as e-beam writing typically cover only a small area in the range of several square millimeters which is only the size of an individual micro-optical component. Therefore, a process is required that closes the gap between the size of the individual component to the full wafer scale.

According to a first aspect of the present disclosure, there is provided a method of manufacturing a master for use in a wafer-scale replication process, the method comprising:
  (a) at least one step of forming a layer of photoresist on a substrate and exposing the layer of photoresist to a radiation pattern to form at least one patterned layer; and
  (b) a step of developing the at least one patterned layer to provide one or more structures defining the master.

Advantageously, employing such a method would allow a high degree of control over dimensions of a topography of a surface of the master. In particular, employing the described method, e.g. employing lithographic techniques, to fabricate a master for a replication process would allow precise control over both lateral dimensions, i.e. x and y dimensions, and depth, i.e. y-dimensions of features or structures defining the topography of the surface of the master.

Furthermore, more complicated features or structures may be formed than would be otherwise achievable using conventional techniques, such as CNC machining.

Beneficially, a lead-time for a master manufactured according to the disclosed method may be significantly shortened compared to a lead-time for a master manufactured using conventional techniques, such as CNC machining or the like. As such, beneficially, the disclosed method of manufacturing a master may result in a cheaper overall process flow.

A particular benefit of the disclosed method when used to manufacture a master for use in manufacturing a tool for fabricating spacers and/or optical baffles for micro optical devices is that larger and/or more complex spacer and/or optical baffle designs may be implemented than would be otherwise achievable using conventional replication techniques.

One or more of the at least one step of forming the layer of photoresist may comprise a process of dry film lamination.

A process of dry film lamination may comprise laminating at least a portion of, and preferably an entire surface of, the substrate. That is, at least a portion of the substrate may be laminated, such as with a film of photoresist.

Similarly, the process of dry film lamination may comprise laminating at least a portion of a layer, e.g. a preceding layer, of photoresist with a film of photoresist.

The photoresist may be provided as a film and known as a "dry" film, when considered relative to a liquid photoresist.

Such a film may be applied with a controlled degree of pressure and/or temperature.

Benefits of such dry film lamination may include improved adhesion of the film of photoresist to the substrate or preceding layer.

Furthermore, use of a film of photoresist may provide uniformity of a thickness of the photoresist layer across large area, e.g. across entire wafer.

Beneficially, the use of a film of photoresist may allow a thicker layer photoresist to be applied to the substrate than would otherwise be achievable by means of a liquid photoresist, thus potentially reducing a number of processing steps required to manufacture the master.

Further benefits include relatively simple handling and short processing times of film of photoresist relative to handling and processing liquid photoresist.

Furthermore, a set-up cost for implementing dry film processing can be significantly lower than for liquid photoresists.

In a particular embodiment, the dry film has pressure-sensitive adhesive properties. That is, the dry film may be provided as a pressure sensitive dry resist film.

In another embodiment, the process of process of dry film lamination may comprise application of a pressure sensitive adhesive. That is, a pressure sensitive adhesive may be applied to the substrate or to a preceding layer of photoresist prior to lamination with a film of photoresist.

In a particular embodiment, the dry film has heat-sensitive adhesive properties. That is, the dry film may be provided as a heat sensitive dry resist film. The dry film may be provided as a heat and/or pressure sensitive dry resist film.

In an embodiment, the substrate may be heated prior to the process of dry film lamination. Such heating may enhance an adhesion of the film of photoresist.

One or more of the at least one step of forming a layer of photoresist may comprise a process of spraying and/or spin-coating a liquid photoresist.

Spraying and/or spin coating a liquid photoresist layer may beneficially allow application of a particularly thin layer of photoresist, relative to a laminated film of photoresist.

Furthermore, by combining layers of dry-film photoresist and layers of sprayed/spin coated liquid photoresist, complicated structures can be fabricated with, for example, complex combinations and sequences of relatively thin and thick layers of photoresist to create small and large topographical features respectively.

Exposing the layer(s) of photoresist to a radiation pattern may comprise projecting one or more radiation patterns onto the/each layer of photoresist directly.

That is, the one or more radiation patterns may be patterned onto the/each layer of photoresist without using a photoreticle. In some embodiments, a process of Laser Direct Imaging (LDI) may be employed to directly project one or more radiation patterns onto the/each layer of photoresist.

In some embodiments the radiation may comprise UV radiation. In some embodiments, and depending upon characteristics of a selected photoresist, the radiation may alternatively or additionally comprise electron-beams and/or infrared radiation.

The one or more radiation patterns may define one or more elements for a micro-optical device. In particular, the one or more radiation patterns may define one or more spacers and/or baffles for a micro-optical device.

Exposing the layer(s) of photoresist to a radiation pattern may comprise projecting one or more radiation patterns onto the/each layer of photoresist through a mask. That is, a photoreticle may be used to define one or more patterns for projecting onto the/each layer of photoresist.

Step (a) may comprise forming a plurality of patterned layers of photoresist on the substrate.

In this manner, a master comprising complex structures, i.e. a complex topographical surface, may be formed.

A pattern formed on each consecutive layer of photoresist may at least partly correspond to and/or overlap a pattern formed on a preceding layer of photoresist.

As such, patterned portions of the layers of photoresist may be built up in a stacked manner to define structures that remain on the substrate following a subsequent step of developing the layers of photoresist (described in more detail below). By ensuring at least a partial overlap, such structure may exhibit sufficient structural integrity to be suitable for a subsequent application of a conformal layer (also described in more detail below).

Step (a) may comprise a step of baking the substrate before and/or after exposing the/each layer of photoresist to the radiation pattern.

The radiation pattern may be of sufficient intensity and or a sufficient wavelength, e.g. UV light, to alter characteristics of the photoresist. That is, in the case of the/each layer of photoresist comprising a positive photoresist, a portion of the the/each layer of photoresist that is exposed to radiation becomes soluble to the developer, and an unexposed portion of the/each layer of photoresist remains insoluble to the developer. Similarly, in the case of the/each layer of photoresist comprising a negative photoresist, a portion of the/each layer of photoresist that is exposed to light becomes insoluble to the developer and the unexposed portion of the/each layer of photoresist remains soluble to the developer.

In some embodiments, following the process of dry film lamination, the substrate may be baked. The baking of the substrate may be a pre-bake, also known as a soft-bake, and may primarily serve a purpose of removing any residual solvent on the resist film and/or removing contaminants. Furthermore, a pre-bake or soft bake may ensure adhesion of a film to the substrate, or to a preceding layer.

In some embodiments, following exposure of the/each layer of photoresist to radiation, the substrate may be baked. Such a bake may be known as a post-exposure bake. A post exposure bake may beneficially complete a photoreaction initiated in the/each layer of photoresist during an exposure to radiation.

In some embodiments, the substrate may be subjected to baking after development of the/each layer of photoresist. Such a bake may be known as a 'hard bake'. Such a bake may beneficially increase a physical stability of structures.

The step of developing the at least one patterned layer to provide one or more structures may comprise exposing the at least one patterned layer to a developer by spraying and/or soaking and/or spin coating. The step of developing the at least one patterned layer to provide one or more structures may comprise spraying and/or soaking and/or spin coating the at least one patterned layer with a developer.

The developer may be, for example, a solvent.

In some embodiments, the/each layer of photoresist comprises a negative photoresist, such that portions of the/each layer of photoresist that have not been exposed to the radiation pattern is dissolved by the developer. It will be appreciated that in other embodiments falling within the scope of the disclosure, the/each/at least one layer of photoresist may comprise a positive photoresist.

A/the process of dry film lamination may be used to form one or more layers having a thickness greater than a predetermined threshold and/or a/the process of spraying/spin-coating a liquid photoresist is used to form one or more layers having a thickness less than or equal to the predetermined threshold.

That is, selection of a combination of process steps involving dry film lamination and spraying/spin-coating a liquid photoresist may be used to form structures having a defined sequence of relatively thick and relatively thin layers of photoresist.

The predetermined threshold may be within a range of 5 to 15 micrometres. The predetermined threshold may be approximately 10 um. The predetermined threshold may be determined based upon characteristics, such as a viscosity, of the liquid photoresist.

According to a second aspect of the present disclosure, there is provided a method of manufacturing a sub-master for use in a replication process, the method comprising a step of forming one or more sub-masters by a process of replication using a master manufactured according to the method of the first aspect.

That is, a tool may be formed from the master. The tool may be a negative Polydimethylsiloxane (PDMS) tool, e.g. a mould of the master. The tool may, in turn, be used for a process, such as a vacuum injection moulding process with, for example, an epoxy, to form an optical element. The tool may, in turn, be used for a process, such as a vacuum injection moulding process with, for example, PDMS, to form a sub-master.

Each of the one or more sub-masters may be considered a first generation sub-master. The one or more sub-masters may subsequently be used to manufacture a second, third or further generation sub-masters.

In use, residue may accumulate on a surface of a master or a tool formed from a master. As such, by using one or more sub-masters, the original master and/or tool may be protected.

According to a third aspect of the present disclosure, there is provided a method of manufacturing a tool for use in a wafer-scale replication process, the method comprising the steps of:

(c) forming a conformal layer of hardenable material over one or more structures of a master manufactured according to the first aspect or a sub-master manufactured according to the second aspect; and (d) separating the conformal layer from the one or more structures of the master or sub-master after hardening of the conformal layer, wherein the hardened conformal layer is the tool.

Step (c) may be preceded by a process of forming a mould-release layer over the one or more structures, e.g. the one of more structures of the master or sub-master.

Beneficially, application of a mould release layer, or coating, may allow easy separation from a subsequent layer, such as a Polydimethylsiloxane (PDMS) layer as described below in more detail. Advantageously, provision of a mould release layer, may reduce a pressure required to remove a subsequent layer, thus mitigating risk of damage or deformation of the subsequent layer.

The mould release layer may be formed from a mould release agent, such as hydrophobic silane, or the like. The mould release layer may be formed as a hydrophobic coating. The mould release layer may comprise a fluorinated compound.

Step (c) comprises moulding the hardenable material between the substrate and a backing.

The moulding may be injection moulding. The moulding may be vacuum injection moulding.

The backing may comprise, for example, a further substrate. The backing may comprise a sheet, plate or the like. The backing may comprise glass. The backing may be metallic. The backing may comprise copper or steel. The backing may be substantially planar and/or comprise a substantially planar surface.

In use, the backing may be disposed substantially parallel to the substrate, thus providing a gap between the backing and the substrate. For example, the substrate and the backing may be clamped or otherwise held in position relative to one another.

The hardenable material may be injected, poured, or otherwise motivated, into the gap. That is, the hardenable material may disposed within the gap. The hardenable material may at least partially, or substantially completely, coat a patterned surface of the substrate, such that the hardenable material conforms to a topography of the surface.

The backing may be provided with one or more channels for injecting, pouring, or otherwise motivating the hardenable material into the gap. Similarly, the backing may be provided with one or more further channels for exiting a gas, such as air, during a process of disposing the hardenable material within the gap.

The hardenable material may comprise Polydimethylsiloxane (PDMS). The hardenable material may comprise a silicone compound. The hardenable material may be mixed with a cross-linking agent for curing the hardenable material. The hardenable material may be heated to increase a degree of viscoelasticity.

According to a fourth aspect of the present disclosure, there is provided a master manufactured according to the first aspect, or a sub-master manufactured according to the second aspect, or a tool manufactured according to the third aspect.

According to a fifth aspect of the present disclosure, there is provided a method of fabricating at least one element for a micro-optical device, the method comprising a process of replication employing a tool manufactured according to the third aspect.

The method may comprises providing a liquid, viscous or plastically deformable material may be provided onto a substrate or sheet and/or onto a surface of the tool. The method may comprise motivating the substrate or sheet and the tool towards one another, e.g. pressing the tool against the substrate or sheet, such that the liquid, viscous or plastically deformable material is pressed between a surface of the substrate or sheet and a surface of the tool. The method may comprise hardening the liquid, viscous or plastically deformable material to form the element on a surface of the substrate or sheet. The surface or sheet may be a glass substrate, a printed circuit board assembly (PCBA), a polymer resin such as a polyethylene terephthalate (PET) sheet as a temporary backing film, or the like.

The at least one element may comprises a spacer.

The at least one element may comprises an optical baffle.

According to a sixth aspect of the present disclosure, there is provided a micro-optical device comprising at least one element manufactured according the fifth aspect.

The above summary is intended to be merely exemplary and non-limiting. The disclosure includes one or more corresponding aspects, embodiments or features in isolation or in various combinations whether or not specifically stated (including claimed) in that combination or in isolation. It should be understood that features defined above in accordance with any aspect of the present disclosure or below relating to any specific embodiment of the disclosure may be utilized, either alone or in combination with any other defined feature, in any other aspect or embodiment or to form a further aspect or embodiment of the disclosure.

BRIEF DESCRIPTION OF DRAWINGS

These and other aspects of the present disclosure will now be described, by way of example only, with reference to the accompanying drawings, which are.

DETAILED DESCRIPTION OF DRAWINGS

Figure 1:
FIG. 1 depicts a substrate for use in a process of manufacturing a master for use in a wafer-scale replication process, according to an embodiment of the disclosure.

FIG. 1 depicts a substrate 100 for use in a process of manufacturing a master 205 for use in a wafer-scale replication process, according to an embodiment of the disclosure. The substrate 100 may be, for example, a glass substrate, such as a silicon substrate or the like. The substrate 100 may be clamped to a chuck, or a wafer table. References hereinafter to a wafer may be construed as referring to a substrate.

Figure 2:
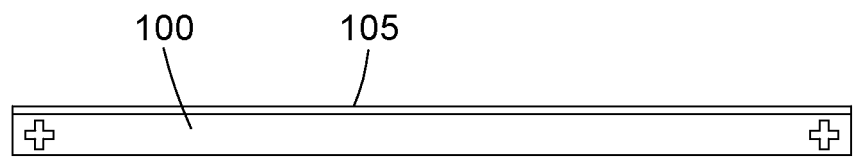
FIG. 2 depicts the substrate of FIG. 1 comprising a first layer of photoresist.

FIG. 2 depicts the substrate 100 of FIG. 1 comprising a first layer of photoresist 105. The first layer of photoresist 105 comprises a dry resist film. That is, the first layer of photoresist 105 is formed by a process of dry film lamination.

The process of dry film lamination may comprise laminating at least a portion of, and preferably an entire surface of, the substrate 100. At least a portion of the substrate 100 may be laminated, with the first layer of photoresist 105.

Such a first layer of photoresist 105 may be applied with a controlled degree of pressure and/or temperature. The first layer of photoresist 105, or any intermediate layer, may be pressure sensitive and/or heat sensitive, such that application of pressure and/or heat enhances adhesion of the first layer of photoresist 105 to the substrate 100. In some embodiments, the substrate 100 may be heated prior to the process of dry film lamination. Such heating may enhance an adhesion of the first layer of photoresist 105 to the substrate 100.

In some embodiments, the first layer of photoresist 105 may be a layer of positive resist. Alternatively, in some embodiments the first layer of photoresist 105 may be a layer of negative resist, as described below in further detail.

A dry film resist, e.g. a laminate, may be used for applying photoresist with a thickness greater than that which would normally be achieved by spraying or spin-coating a liquid photoresist. As such, in the example of FIG. 2, the first layer of photoresist 105 is generally over 10 µm in thickness.

Figure 3:
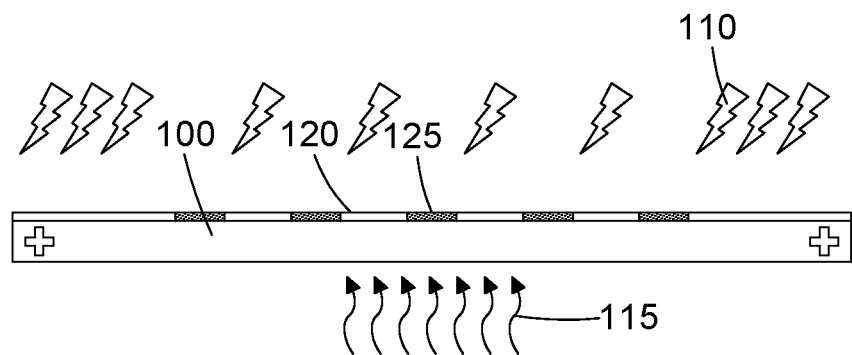
FIG. 3 depicts a process of baking and patterning the first layer of photoresist.

FIG. 3 depicts a process of baking and patterning the first layer of photoresist 105. The first layer of photoresist 105 may be patterned by exposing the layer of photoresist to a first radiation pattern 110 to form at least one patterned layer.

In some embodiments, the first radiation pattern 110 may be patterned onto the first layer of photoresist 105 using a photoreticle, e.g. a mask.

In some embodiments, the first radiation pattern 110 may be patterned onto the first layer of photoresist 105 without using a photoreticle. In some embodiments, a process of Laser Direct Imaging (LDI) may be employed to directly project one or more radiation patterns onto the first layer of photoresist 105.

In some embodiments the first radiation pattern 110 may comprise UV radiation. In some embodiments, and depending upon characteristics of the first layer of photoresist 105, the first radiation pattern 110 may alternatively or additionally comprise electron-beams and/or infrared radiation.

The first radiation pattern 110 may define one or more elements for a micro-optical device. In particular, the first radiation pattern 110 may define profiles of one or more spacers and/or baffles for a micro-optical device.

The first radiation pattern 110 may be of sufficient intensity and or a sufficient wavelength, e.g. UV light, to alter characteristics of the first layer of photoresist 105. In the example depicted in FIG. 3, the first layer of photoresist 105 comprises a negative photoresist. As such, an exposed portion 120 of the first layer of photoresist 105 that is exposed to the first radiation pattern 110 may become insoluble to a developer, and an unexposed portion 125 of the/each layer of photoresist may remain soluble to the developer.

The first layer of photoresist 105 may be baked by application of heat 115. The heat 115 may be applied before, during and/or after patterning the first layer of photoresist 105 by exposing the first layer of photoresist 105 to a radiation pattern.

Figure 4:
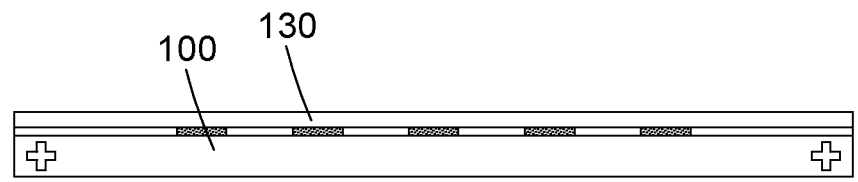
FIG. 4 depicts the substrate of FIG. 3 with a second layer of photoresist applied to the substrate.

FIG. 4 depicts the substrate of FIG. 3 with a second layer of photoresist 130 applied to the substrate 100. Specifically, the second layer of photoresist 130 is formed on the preceding first layer of photoresist 105. For purposes of example only, the second layer of photoresist 130 comprises a dry resist film. That is, the second layer of photoresist 130 is formed by a process of dry film lamination.

For purposes of example only, and to illustrate how complex structures may be formed, the second layer of photoresist 130 has a thickness that is different to a thickness of the first layer of photoresist 130.

Figure 5:
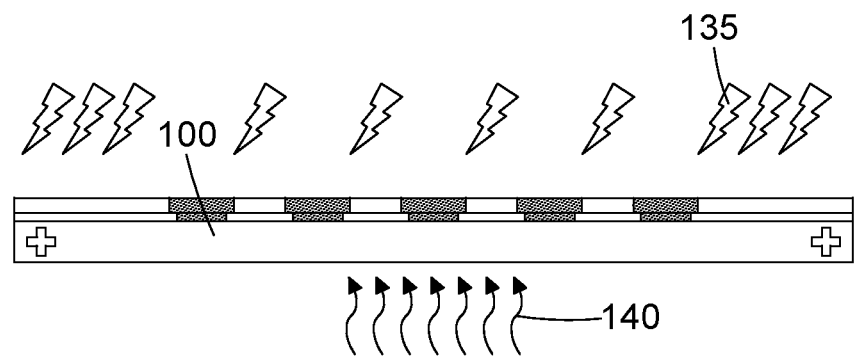
FIG. 5 depicts a process of baking and patterning the second layer of photoresist.

Similarly, a second radiation pattern 135 may be patterned onto the second layer of photoresist 130. In the example of FIG. 5, a pattern formed on the second layer of photoresist 135 corresponds to and overlaps the pattern formed on the first layer of photoresist 105. As such, patterned portions of the layers of photoresist 105, 130 may be built up in a stacked manner to define structures that remain on the substrate 100 following a subsequent step of developing the layers of photoresist (described in more detail below). By ensuring at least a partial overlap, such structures may exhibit sufficient structural integrity to be suitable for a subsequent application of a conformal layer (also described in more detail below).

The general process of patterning the second layer of photoresist 130 may be comparable to the processes described above for patterning the first layer of photoresist 105, and is not described in further detail for purposes of brevity. Similarly, the second layer of photoresist 130 may be baked by application of heat 140. The heat 140 may be applied before, during and/or after patterning the second layer of photoresist 130 by exposing the second layer of photoresist 130 to the second radiation pattern 135.

Figure 6:
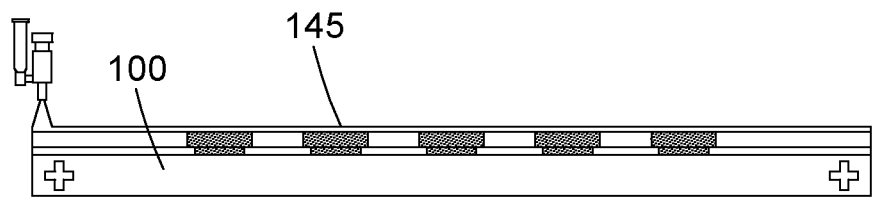
FIG. 6 depicts a step of spraying a third layer of photoresist on to the substrate of FIG. 5.

In some instances, a relatively thin layer of photoresist may be applied to the substrate 100. In the example embodiment of FIG. 6, a third layer of photoresist 145 if formed by a process of spraying and/or spin-coating a liquid photoresist onto the substrate 100. Specifically, the third layer of photoresist 145 is formed on the preceding second layer of photoresist 130.

Spraying and/or spin coating a liquid photoresist layer may beneficially allow application of a particularly thin layer of photoresist, relative to a laminated film of photoresist.

Furthermore, by combing layers of dry-film photoresist, such as the first and second layers of photoresist 105, 130, and layers of sprayed/spin coated liquid photoresist, such as the third layer of photoresist 145, complicated structures can be fabricated on the substrate 100. For example, complex combinations and sequences of relatively thin and thick layers of photoresist may be formed, and patterned, to create small and large topographical features respectively.

Figure 7:
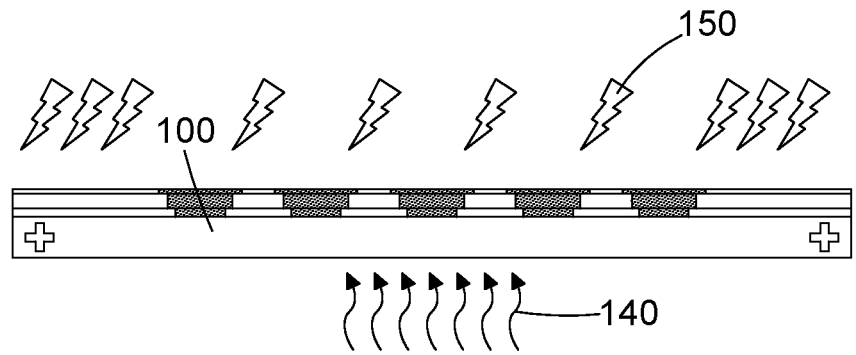
FIG. 7 depicts a process of baking and patterning the third layer of photoresist.

As depicted in FIG. 7, the third layer of photoresist 145 may be baked by application of heat 140. The heat 140 may be applied before, during and/or after patterning the third layer of photoresist 145 by exposing the third layer of photoresist 145 to a third radiation pattern 150.

Figure 8:
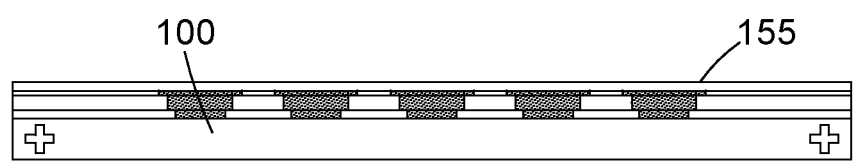
FIG. 8 depicts the substrate of FIG. 7 with a fourth layer of photoresist applied to the substrate.

For purposes of example, FIG. 8 depicts a fourth layer of photoresist 155 applied to the substrate 100. Specifically, the fifth layer of photoresist 155 is formed on the preceding fourth layer of photoresist 145. For purposes of example only, the fourth layer of photoresist 155 comprises a dry resist film.

Figure 9:
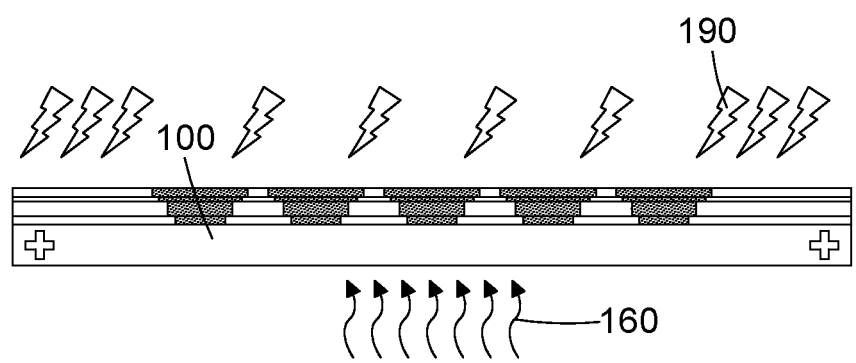
FIG. 9 depicts a process of baking and patterning the fourth layer of photoresist.

As depicted in FIG. 9, the fourth layer of photoresist 155 may be baked by application of heat 160. The heat 160 may be applied before, during and/or after patterning the fourth layer of photoresist 155 by exposing the fourth layer of photoresist 155 to a fourth radiation pattern 190.

As can be seen on the example of FIG. 9, patterns formed on each layer of photoresist 130, 145, 155 corresponds to and overlaps a pattern formed on a preceding layer of photoresist 105, 130, 145. As such, patterned portions of the layers of photoresist 105, 130, 145, 155 may be built up in a stacked manner to define structures that remain on the substrate 100 following a subsequent step of developing the layers of photoresist (described in more detail below).

Figure 10:
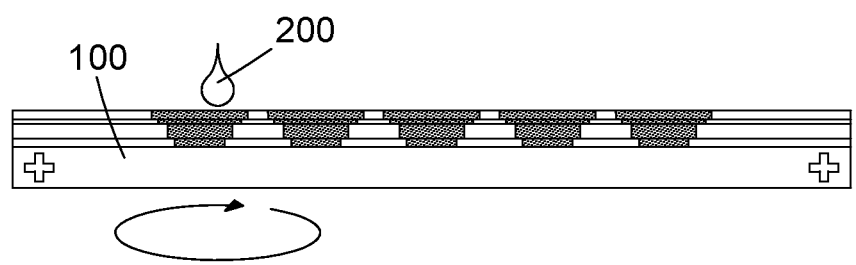
FIG. 10 depicts a process of developing the layers of photoresist.

FIG. 10 depicts a process of developing the layers of photoresist 105, 130, 145, 155. Developing the layers of photoresist 105, 130, 145, 155 may comprise exposing the patterned layers of photoresist 105, 130, 145, 155 to a developer 200, e.g. a solvent. In the example of FIG. 10, the developer 200 is applied by spin coating the substrate 100.

Each patterned layer of photoresist 105, 130, 145, 155 comprises a negative photoresist, such that portions of the/each layer of photoresist that have not been exposed to the radiation pattern are dissolved by the developer.

Figure 11:
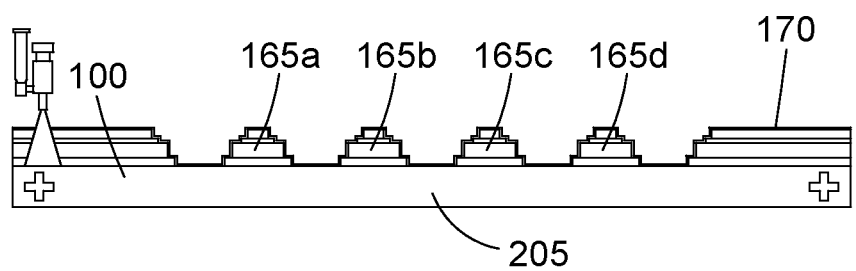
FIG. 11 depicts a process of applying a mould release agent to the substrate.

FIG. 11 depicts the substrate 100 after the process of developing the layers of photoresist 105, 130, 145, 155. Structures 165a, 165b, 165c, 165d are formed of the substrate, each structure 165a, 165b, 165c, 165d comprising portions of the first, second, third and fourth layers of photoresist 105, 130, 145, 155. As such, the substrate 100 comprising the structures 165a, 165b, 165c, 165d is a master 205. For purposes of example only, four structures 165a, 165b, 165c, 165d are shown. One will appreciate that other quantities and shapes of structures 165a, 165b, 165c, 165d may be formed, comprising a greater or smaller number of layers of photoresist, and comprising any combination of layers of dry resist film and spin-coated liquid resist.

FIG. 11 also depicts formation of a mould-release layer 170 over the master 205, and more specifically over the structures 165a, 165b, 165c, 165d. Beneficially, application of a mould release layer 170, or coating, may allow easy separation from a subsequent layer, such as a Polydimethylsiloxane (PDMS) layer as described below in more detail. Advantageously, provision of a mould release layer 170, may reduce a pressure required to remove a subsequent layer, thus mitigating risk of damage or deformation of the subsequent layer.

The mould release layer 170 may be formed from a mould release agent, such as hydrophobic silane, or the like. The mould release layer may be formed as a hydrophobic coating. The mould release layer may comprise a fluorinated compound.

Figure 12:
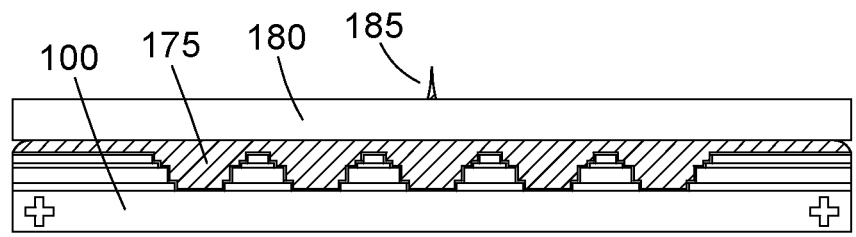
FIG. 12 depicts a process of dispensing PDMS on the substrate.

FIG. 12 depicts a process of dispensing a conformal layer 175 of a hardenable material, e.g. PDMS, on the substrate 100. That is, the conformal layer 175 conforms to a topology of the patterned substrate 100, e.g. conforms to the shape of the structures 165a, 165b, 165c, 165d. The conformal layer 175 defines a tool 210, as described in more detail below. As such, the tool 210 may be a negative of the master 205.

The hardenable material forming the conformal layer 175 is moulded between the substrate 100 and a backing 180. The moulding may be injection moulding. The moulding may be vacuum injection moulding.

The backing 180 may comprise, for example, a further substrate. The backing 180 may comprise a sheet, plate or the like. The backing 180 may comprise glass. The backing 180 may be metallic. The backing 180 may comprise copper or steel. The backing 180 may be substantially planar and/or comprise a substantially planar surface.

As depicted in FIG. 12, the backing 180 may be disposed substantially parallel to the substrate 100, thus providing a gap between the backing 180 and the substrate 100. For example, the substrate 100 and the backing 180 may be clamped or otherwise held in position relative to one another.

The hardenable material may be injected, poured, or otherwise motivated, into the gap. That is, the hardenable material may disposed within the gap. The hardenable material at least partially coat the patterned surface of the substrate 100, such that the hardenable material conforms to a topography of the substrate 100, e.g. conforms to the structures 165a, 165b, 165c, 165d.

In some embodiments, the backing 180 may be provided with one or more channels 185 for injecting, pouring, or otherwise motivating the hardenable material into the gap.

Similarly, the backing 180 may be provided with one or more further channels (not shown) for exiting a gas, such as air, during a process of disposing the hardenable material within the gap.

The hardenable material may comprise Polydimethylsiloxane (PDMS). The hardenable material may comprise a silicone compound. The hardenable material may be mixed with a cross-linking agent for curing the hardenable material. The hardenable material may be heated to increase a degree of viscoelasticity.

Figure 13:
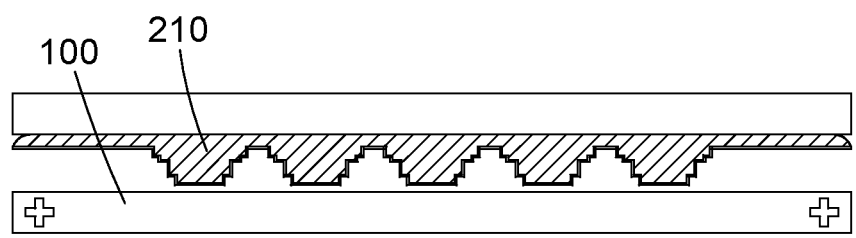
FIG. 13 depicts a process of separating the PDMS from the substrate to form a tool.

FIG. 13 depicts separation of the hardenable material in a hardened state from the master 205. As described above with reference to FIG. 11, provision of a mould release layer 170 eases separation of the hardened material from the master 205. The separated hardened material defines the tool 210.

Figure 14:
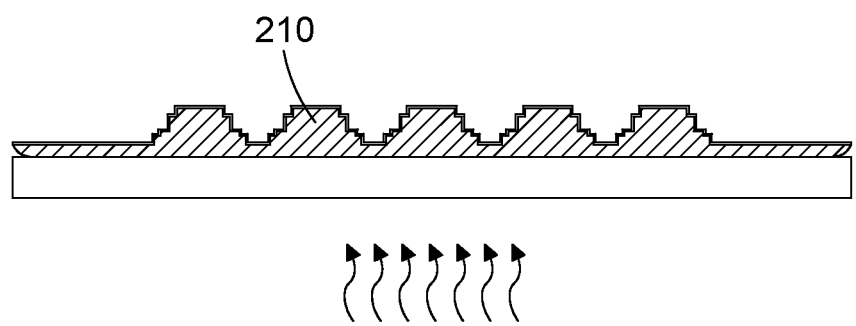
FIG. 14 depicts a process of baking the tool.

As depicted in FIG. 14, in some embodiments the tool 210 may be baked. Beneficially, such a bake may increase a physical stability of the tool 210.

The tool 210 may be used to form at least one element for a micro-optical device. In some embodiments, the tool 210 may be used for sub-mastering, as will be described in more detail with reference to FIG. 15.

In use, residue may accumulate on a surface of a master 205 or a tool 210 formed from a master. As such, by using one or more sub-masters, the original master 205 and/or tool 210 may be protected.

Figure 15:
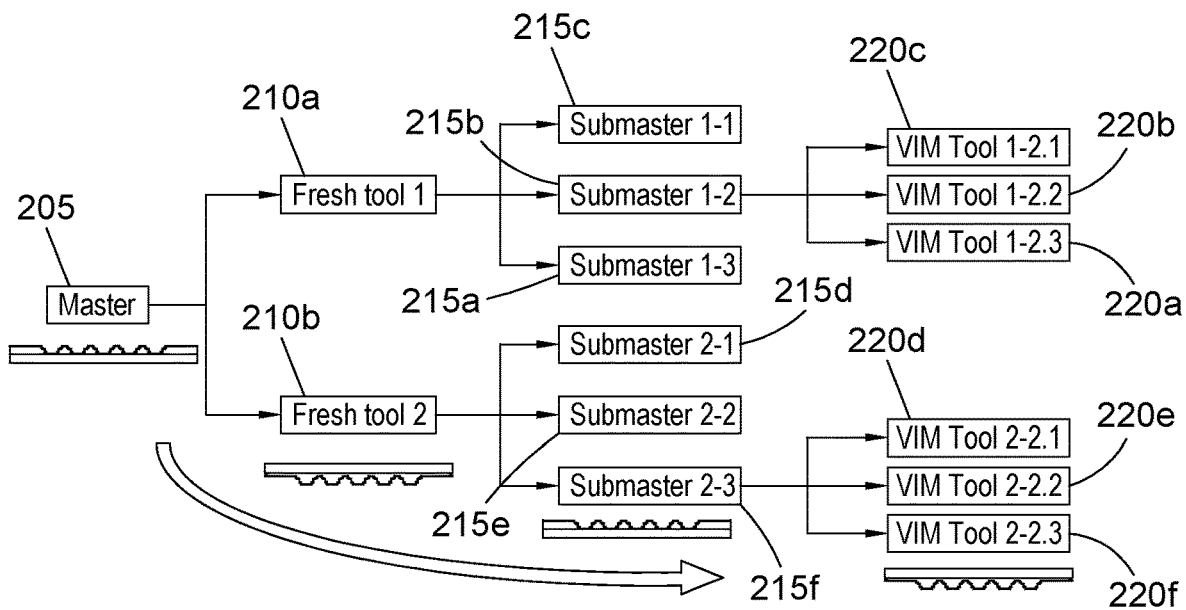
FIG. 15 depicts a process of sub-mastering.

FIG. 15 depicts a process of sub-mastering. The master 205, as manufactured according to the method described above with reference to FIGS. 1 to 11, may be used to manufacturing one or more tools 210a, 210b for use in a wafer-scale replication process. That is, one or more tools 210a, 210b may be manufactured by a process comprising the steps of: forming a conformal layer of hardenable material over the master 205 as described above with reference to FIG. 12, and subsequently separating the conformal layer from the master 205 after hardening of the conformal layer, as described above with reference to FIG. 13

In the example of FIG. 15, two tools 210a, 210b are manufactured. It will be appreciated that the master 205 may be used to generate one, or more than two tools.

In a process known in the art as "sub-mastering", each tool 210a, 210b may be used to generate one or more sub-masters 215a-f, wherein each sub-master 215a-f is, effectively, a duplicate of the master 205. That is, one or more sub-masters 215a-f may be formed by a process of replication from an original master 205.

The tools 210a, 210b, which may be formed from PDMS, are moulds of the master 205. Therefore, the tools 210a, 210b may, in turn, be used in a process, such as a vacuum injection moulding with an epoxy or the like to form one or more sub-masters 215a-f.

Each of the one or more sub-masters 215a-f may be considered a first generation sub-master 215a-f. In some embodiments, the one or more sub-masters 215a-f may subsequently be used to manufacture a second, third or further generation sub-master.

As depicted in FIG. 15, the sub-masters 215a-f may subsequently be used to form a plurality of tools 220a-f. In some embodiments, the plurality of tools 220a-f may be formed from the sub-masters 215a-f by essentially the same process that the two tools 210a, 210b are formed from the master 205.

Figure 16:
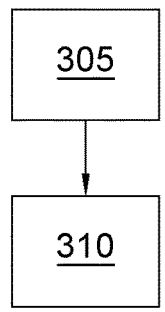
FIG. 16 depicts a method of manufacturing a master for use in a wafer-scale replication process according to an embodiment of the disclosure.

FIG. 16 depicts a method of manufacturing a master for use in a wafer-scale replication process, according to an embodiment of the disclosure.

The method comprises at least one first step 305 of forming a layer of photoresist on a substrate and exposing the layer of photoresist to a radiation pattern to form at least one patterned layer.

Figure 17:
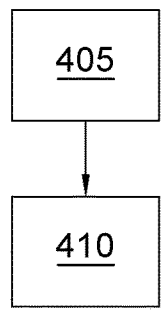
FIG. 17 depicts a method of manufacturing a tool for use in a wafer-scale replication process, according to an embodiment of the disclosure.

The method comprises at least one second step 310 of developing the at least one patterned layer to provide one or more structures defining the master FIG. 17 depicts a method of manufacturing a tool for use in a wafer-scale replication process, the method comprising a first step 405 of forming a conformal layer of hardenable material over one or more structures of a master or submaster manufactured according to the methods described above with reference to FIGS. 1 to 14.

The method also comprises a subsequent second step 410 of separating the conformal layer from the one or more structures of the master or sub-master after hardening of the conformal layer, wherein the hardened conformal layer is the tool.

The Applicant discloses in isolation each individual feature described herein and any combination of two or more such features, to the extent that such features or combinations are capable of being carried out based on the specification as a whole in the light of the common general knowledge of a person skilled in the art, irrespective of whether such features or combinations of features solve any problems disclosed herein, and without limitation to the scope of the claims. The applicant indicates that aspects of the disclosure may consist of any such individual feature or combination of features. In view of the foregoing description it will be evident to a person skilled in the art that various modifications may be made within the scope of the disclosure.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure, which are contemplated as falling within the scope of the appended claims. Each feature disclosed or illustrated in the present specification may be incorporated in any embodiments, whether alone or in any appropriate combination with any other feature disclosed or illustrated herein.

LIST OF REFERENCE NUMERALS

| | |
|---|---|
| 100 | Substrate |
| 105 | first layer of photoresist |
| 110 | first radiation pattern |
| 115 | heat |
| 120 | exposed portion |
| 125 | unexposed portion |
| 130 | second layer of photoresist |
| 135 | second radiation pattern |
| 140 | heat |
| 145 | third layer of photoresist |
| 150 | third radiation pattern |
| 160 | heat |
| 165a | structure |
| 165b | structure |
| 165c | structure |
| 165d | structure |
| 170 | mould-release layer |
| 175 | conformal layer |
| 180 | backing |
| 190 | fourth radiation pattern |
| 200 | developer |
| 205 | master |

-continued

| | |
|---|---|
| 210a | tool |
| 210b | tool |
| 215a | sub-master |
| 215b | sub-master |
| 215c | sub-master |
| 215d | sub-master |
| 215e | sub-master |
| 215f | sub-master |
| 220a | tool |
| 220b | tool |
| 220c | tool |
| 220d | tool |
| 220e | tool |
| 220f | tool |
| 305 | first step |
| 310 | second step |
| 405 | first step |
| 410 | second step |

The invention claimed is:

1. A method of manufacturing a master for use in a wafer-scale replication process, the method comprising:
   (a) at least one step of forming a layer of photoresist on a substrate and exposing the layer of photoresist to a radiation pattern to form at least one patterned layer; and
   (b) a step of developing the at least one patterned layer to provide one or more structures defining the master;
   wherein step (b) comprises spraying and/or spin coating the at least one patterned layer with a developer,
   wherein a/the process of dry film lamination is used to form one or more layers having a thickness of 5 to 10 micrometers and/or a/the process of spaying/spin-coating a liquid photoresist is used to form one or more layers having a thickness of 5 to 10 micrometers.

2. The method of claim 1 wherein the at least one step of forming the layer of photoresist comprises a process of dry film lamination.

3. The method of claim 1 wherein the at least one step of forming a layer of photoresist comprises a process of spaying and/or spin-coating a liquid photoresist.

4. The method of claim 1, wherein exposing the layer(s) of photoresist to a radiation pattern comprises projecting one or more radiation patterns onto the/each layer of photoresist directly and/or through a mask.

5. The method of claim 1 wherein step (a) comprises forming a plurality of patterned layers of photoresist on the substrate, and wherein a pattern formed on each consecutive layer of photoresist at least partly corresponds to and/or overlaps a pattern formed on a preceding layer of photoresist.

6. The method of claim 1, wherein step (a) comprises a step of baking the substrate before and/or after exposing the/each layer of photoresist to the radiation pattern.

7. A method of manufacturing a sub-master for use in a replication process, the method comprising a step of forming a sub-master by a process of replication using a master manufactured according to claim 1.

8. A method of manufacturing a tool for use in a wafer-scale replication process, the method comprising the steps of:
   (c) forming a conformal layer of hardenable material over one or more structures of a master or sub-master manufactured according to claim 1; and
   (d) separating the conformal layer from the one or more structures of the master or sub-master after hardening of the conformal layer, wherein the hardened conformal layer is the tool.

9. The method of claim 8, wherein step (c) is preceded by a process of forming a mould-release layer over the one or more structures of the master or sub-master.

10. The method of claim 8 wherein step (c) comprises moulding the hardenable material between the substrate of the master or sub-master and a backing.

11. The method of claim 8, wherein the hardenable material comprises Polydimethylsiloxane (PDMS).

12. A master manufactured according to the method of claim 1.

13. A method of fabricating at least one element for a micro-optical device, the method comprising a process of replication employing a tool manufactured according to the method of claim 1.

14. The method of claim 13, wherein the at least one element comprises a spacer and/or an optical baffle.

15. A micro-optical device comprising at least one element manufactured according the method of claim 13.

16. A sub-master manufactured according to the method of claim 7.

17. A tool manufactured according to the method of claim 8.

* * * * *